(12) United States Patent
Yang

(10) Patent No.: US 9,773,735 B1
(45) Date of Patent: Sep. 26, 2017

(54) GEOMETRY CONTROL IN ADVANCED INTERCONNECT STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/238,339

(22) Filed: Aug. 16, 2016

(51) Int. Cl.
*H01L 23/52* (2006.01)
*H01L 23/528* (2006.01)
*H01L 21/768* (2006.01)
*H01L 21/027* (2006.01)
*H01L 23/522* (2006.01)
*H01L 23/532* (2006.01)

(52) U.S. Cl.
CPC ...... *H01L 23/5283* (2013.01); *H01L 21/0273* (2013.01); *H01L 21/76804* (2013.01); *H01L 21/76846* (2013.01); *H01L 21/76879* (2013.01); *H01L 21/76883* (2013.01); *H01L 23/5226* (2013.01); *H01L 23/53219* (2013.01); *H01L 23/53223* (2013.01); *H01L 23/53233* (2013.01); *H01L 23/53238* (2013.01)

(58) Field of Classification Search
CPC ......... H01L 2924/0002; H01L 2924/00; H01L 21/76831; H01L 21/76843; H01L 21/76844; H01L 21/76846; H01L 21/76877; H01L 23/53238
See application file for complete search history.

(56) References Cited

U.S. PATENT DOCUMENTS

| | | |
|---|---|---|
| 6,491,978 B1 | 12/2002 | Kalyanam |
| 6,528,180 B1 | 3/2003 | Lee et al. |
| 6,680,538 B2 | 1/2004 | Kim et al. |
| 6,736,701 B1 | 5/2004 | Shue et al. |
| 6,783,868 B2 | 8/2004 | Ciotti et al. |
| 6,910,947 B2 | 6/2005 | Paik |
| 6,913,938 B2 | 7/2005 | Shanmugasundram et al. |
| 6,919,636 B1 | 7/2005 | Ryan |
| 6,936,843 B2 | 8/2005 | Cui |
| 6,950,716 B2 | 9/2005 | Ward et al. |
| 6,952,052 B1 | 10/2005 | Marathe et al. |
| 6,961,626 B1 | 11/2005 | Paik |

(Continued)

*Primary Examiner* — Roy Potter
*Assistant Examiner* — Paul Patton
(74) *Attorney, Agent, or Firm* — Scully, Scott, Murphy & Presser, P.C.; Louis J. Percello, Esq.

(57) ABSTRACT

A via opening is provided in an interconnect dielectric material. Prior to line opening formation, a continuous layer of a sacrificial material is formed lining the entirety of the via opening. An organic planarization layer (OPL) and a photoresist that contains a line pattern are formed above the interconnect dielectric material. The line pattern is then transferred into an upper portion of the interconnect dielectric material, while maintaining a portion of the OPL and a portion of the continuous layer of sacrificial material within a lower portion of the via opening. The remaining portions of the OPL and the sacrificial material are then removed from the bottom portion of the via opening. A combined via opening/line opening is provided in which the via opening has a well controlled profile/geometry. An interconnect metal or metal alloy can then be formed into the combined via opening/line opening.

19 Claims, 4 Drawing Sheets

(56) References Cited

U.S. PATENT DOCUMENTS

| | | |
|---|---|---|
| 6,984,198 B2 | 1/2006 | Krishnamurthy et al. |
| 6,999,836 B2 | 2/2006 | Schwarm et al. |
| 7,040,956 B2 | 5/2006 | Paik |
| 7,069,101 B1 | 6/2006 | Arackaparambil et al. |
| 7,082,345 B2 | 7/2006 | Shanmugasundram et al. |
| 7,272,459 B2 | 9/2007 | Kokotov et al. |
| 7,333,871 B2 | 2/2008 | Schwarm |
| 7,337,019 B2 | 2/2008 | Reiss et al. |
| 7,349,753 B2 | 3/2008 | Paik |
| 7,354,332 B2 | 4/2008 | Surana et al. |
| 7,727,888 B2 | 6/2010 | Yang et al. |
| 9,123,537 B2 * | 9/2015 | Usami ............... H01L 21/02592 |
| 9,536,964 B2 * | 1/2017 | Shiao ................. H01L 29/4175 |

\* cited by examiner

GEOMETRY CONTROL IN ADVANCED INTERCONNECT STRUCTURES

BACKGROUND

The present application relates to semiconductor technology, and more particularly, to a semiconductor structure containing a reliable interconnect structure in which the via profile/geometry is well controlled. The present application also provides a method of making such a semiconductor structure.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0 (i.e., a low k dielectric material).

One challenge facing current interconnect structures is that a large tapered via profile can lead to unwanted shorts to underlying and/or overlying metal lines. These shorts, in turn, can degrade the performance and reliability of the interconnect structure. As such, there is a need for providing an interconnect structure in which the via profile/geometry is sufficiently controlled so as to avoid the formation of a large tapered via profile.

SUMMARY

A via opening is provided in an interconnect dielectric material. Prior to line opening formation, a continuous layer of a sacrificial material is formed lining the entirety of the via opening. An organic planarization layer (OPL) and a patterned photoresist that contains a line pattern are formed above the interconnect dielectric material. The line pattern is then transferred into an upper portion of the interconnect dielectric material, while maintaining a portion of the OPL and a portion of the continuous layer of sacrificial material within a lower portion of the via opening after the transferring. The remaining portions of the OPL and the sacrificial material are then removed from the bottom portion of the via opening. A combined via opening/line opening is provided in which the via opening has a well controlled profile/geometry. An interconnect metal or metal alloy can then be formed into the combined via opening/line opening.

In one aspect of the present application, a method of forming a semiconductor structure is provided. In one embodiment, the method includes forming a via opening in an interconnect dielectric material layer. Next, a continuous layer of a sacrificial material is formed lining the entirety of the via opening. A material stack including at least an organic planarization layer (OPL) and a patterned photoresist is formed above the interconnect dielectric material layer, wherein a portion of the OPL fills a remaining volume of the via opening, and wherein the patterned photoresist includes a line pattern that is present directly above the via opening. Next, the line pattern is transferred to an upper portion of the interconnect dielectric material layer, wherein a portion of the OPL and a portion of the continuous layer of sacrificial material remain within a lower portion of the via opening. The remaining portions of the OPL and the sacrificial material are thereafter removed from the bottom portion of the via opening to provide a combined via opening/line opening. Next, an interconnect metal or metal alloy is formed within the combined via opening/line opening.

In another aspect of the present application, a semiconductor structure is provided. In one embodiment, the semiconductor structure includes an interconnect dielectric material layer containing a combined via opening/line opening, wherein an angle alpha, $\alpha$, as measured from an outside vertical sidewall of the via opening to a bottom horizontal surface of the line opening is from 90° to 110°.

DETAILED DESCRIPTION

Figure 1:
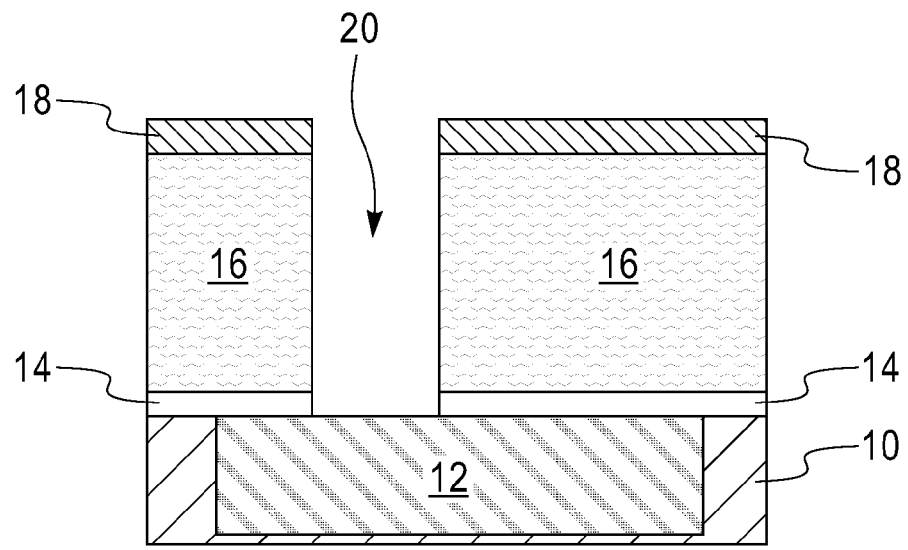
FIG. 1 is a cross sectional view of an exemplary semiconductor structure including a via opening formed in a second interconnect dielectric material layer that exposes a portion of a surface of an interconnect metal or metal alloy embedded in a first interconnect dielectric material layer in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a via opening 20 formed in a second interconnect dielectric material layer 16 that exposes a portion of a surface of an interconnect metal or metal alloy 12 embedded in a first interconnect dielectric material layer 10 in accordance with an embodiment of the present application. The exemplary semiconductor structure also includes, as optional components, a dielectric capping layer 14 located, at least in part, between the first and second interconnect dielectric materials 10, 16 and a hard mask layer 18 located on a topmost surface of the second interconnect dielectric material layer 16.

Although not shown in any of the drawings of the present application, the first interconnect dielectric material layer 10 is located on a surface of a substrate. The substrate may be composed of a semiconductor material, an insulator material, a conductive material or any combination thereof. When the substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, the substrate can be a layered semiconductor such as, for example, Si/SiGe, Si/SiC, silicon-on-insulators (SOIs) or silicon germanium-on-insulators (SGOIs).

When the substrate is an insulator material, the insulator material can be an organic insulator, an inorganic insulator or any combination thereof including multilayers. When the substrate is a conductive material, the substrate may include, for example, polySi, an elemental metal, alloys of elemental metals, a metal silicide, a metal nitride or any combination thereof including multilayers.

When the substrate is composed of a semiconductor material, one or more semiconductor devices such as, for example, complementary metal oxide semiconductor (CMOS) devices can be fabricated thereon. When the substrate is composed of a combination of an insulator material and a conductive material, the substrate may represent an underlying interconnect level of a multilayered interconnect structure.

The first interconnect dielectric material layer 10 that is employed in the present application may be composed of any interlevel or intralevel dielectric material including inorganic dielectrics or organic dielectrics. In one embodiment, the first interconnect dielectric material layer 10 may be non-porous. In another embodiment, the first interconnect dielectric material layer 10 may be porous. Some examples of suitable dielectrics that can be used as the first interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The dielectric material that provides the first interconnect dielectric material layer 10 may be formed by a deposition process such as, for example, chemical vapor deposition (CVD), plasma enhanced chemical vapor deposition (PECVD) or spin-on coating.

The first interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 10 may vary depending upon the type of dielectric material(s) used. In one example, the first interconnect dielectric material layer 10 may have a thickness from 50 nm to 1000 nm. Other thicknesses that are lesser than, or greater than, the aforementioned thickness range may also be employed in the present application for the thickness of first interconnect dielectric material layer 10.

As stated above, an interconnect metal or metal alloy 12 is embedded in the first interconnect dielectric material layer 12. By "embedded" it is meant a material or material stack is located at least in part in another material such that the other material surrounds at least the sidewalls of the material or material stack. As is shown, a topmost surface of the interconnect metal or metal alloy 12 is coplanar with a topmost surface of the first interconnect dielectric material layer 10. Although a single region of an interconnect metal or metal alloy 12 is described and illustrated in the present application, a plurality of such regions of interconnect metal or metal alloy may be embedded in the first interconnect dielectric material layer 10. The interconnect metal or metal alloy 12 is composed of copper (Cu), a copper-aluminum alloy (Cu—Al), a copper-manganese alloy (Cu—Mn), aluminum (Al), or an aluminum-copper alloy (Al—Cu).

The interconnect metal or metal alloy 12 can be formed by first providing at least one opening into the first interconnect dielectric material layer 10 and then filling the at least one opening with a layer of an interconnect metal or metal alloy.

The at least one opening can be formed utilizing a patterning process. In one embodiment, the patterning process may include lithography and etching. The lithographic process includes forming a photoresist (not shown) atop the first interconnect dielectric material layer 10, exposing the photoresist to a desired pattern of radiation and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the at least one opening.

The at least one opening that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening that houses interconnect metal or metal alloy 12 is a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Prior to forming the layer of interconnect metal or metal alloy, a diffusion barrier (not show) can be optionally formed within the at least one opening. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. In some embodiments, the diffusion barrier may have a thickness from 2 nm to 50 nm; although other thicknesses for the diffusion barrier material are contemplated and can be employed in the present application. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, an optional plating seed layer (not specifically shown) can be formed on the surface of the diffusion barrier. In cases in which the metal or metal alloy to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

A layer of interconnect metal or metal alloy is then formed into each opening utilizing a deposition process such as, for example, chemical vapor deposition (CVD), plasma enhanced chemical vapor deposition (PECVD), sputtering, chemical solution deposition or plating. In one embodiment, a bottom-up plating process can be employed. Following the deposition of the layer of interconnect metal or metal alloy, a planarization process such as, for example, chemical mechanical polishing (CMP) and/or grinding, can be used to remove all interconnect metal or metal alloy (i.e., overburden material) that is present outside the at least one opening forming the structure shown in FIG. 1. The planarization stops on a topmost surface of the first interconnect dielectric material layer 10.

FIG. 1 also shows the present of a dielectric capping layer 14. The dielectric capping layer 14 may include any suitable dielectric capping material such as, for example, SiC, $Si_3N_4$, $SiO_2$, a carbon doped oxide, a nitrogen and hydrogen doped silicon carbide SiC(N,H) or multilayers thereof. The dielectric capping material can be formed utilizing a conventional deposition process such as, for example, chemical vapor deposition, plasma enhanced chemical vapor deposition, chemical solution deposition, evaporation, or atomic layer deposition. A continuous layer of the dielectric capping material is formed, and during or, after via 20 formation, the continuous layer of dielectric capping material is patterned to provide dielectric capping layer 14. The thickness of the dielectric capping layer 14 may vary depending on the technique used to form the same as well as the material make-up of the layer. Typically, the dielectric capping layer 14 has a thickness from 15 nm to 100 nm. Other thicknesses that are lesser than, or greater than the aforementioned thickness range may also be employed as the thickness of the dielectric capping layer 14. In some embodiments of the present application, the dielectric capping layer 14 can be omitted.

In the embodiment illustrated in FIG. 1, a second interconnect dielectric material layer 16 is present on the dielectric capping layer 14. Second interconnect dielectric material 16 may include one of the interlevel or intralevel dielectric materials mentioned above for the first interconnect dielectric material layer 10. In one embodiment, the second interconnect dielectric material layer 16 comprises a same dielectric material as the first interconnect dielectric material layer 10. In another, the second interconnect dielectric material layer 16 comprises a different dielectric material than the first interconnect dielectric material layer 10. The dielectric material that provides the second interconnect dielectric material layer 16 can be formed utilizing one of the deposition processes mentioned above in forming the dielectric material that provides the first interconnect dielectric material layer 10. The dielectric material that provides the second interconnect dielectric material layer 16 may have a thickness that is the same as, greater than or lesser than the thickness of the dielectric material that provides the first interconnect dielectric material layer 10.

A hard mask material which provides hard mask layer 18 can optionally be formed on the dielectric material that provides the second interconnect dielectric material layer 16. The hard mask material may include, for example, silicon dioxide, silicon nitride, and/or silicon nitride. In one embodiment, the hard mask material that provides hard mask layer 18 can be formed by a deposition process such as, for example, CVD, or PECVD. In another embodiment, the hard mask material that provides hard mask layer 18 can be formed by a thermal growth process such as, for example, thermal oxidation and/or nitridation. In yet another embodiment, the hard mask material that provides hard mask layer 18 can be formed by a combination of a deposition process and a thermal process. The hard mask material that provides hard mask layer 18 can have a thickness from 20 nm to 50 nm. Other thicknesses are however possible and are not excluded from being used.

Via opening 20 is then formed through the hard mask material (the remaining portions of the hard mask material constitute hard mask layer 18), the dielectric material of the second interconnect dielectric layer (the remaining portions of the interconnect dielectric material constitutes second interconnect dielectric material layer 16), and the dielectric capping material (the remaining portions of the dielectric capping material constitutes dielectric capping layer 14). Via opening 20 can be formed by lithography and etching as defined above. A single etch or multiple etching steps can be used in forming the via opening 20. Via opening 20 has substantially vertical sidewalls relative to the underlying topmost surface of the first interconnect dielectric material layer 10. By "substantially vertically" it is meant that the sidewalls are 90°±5°.

Figure 2:
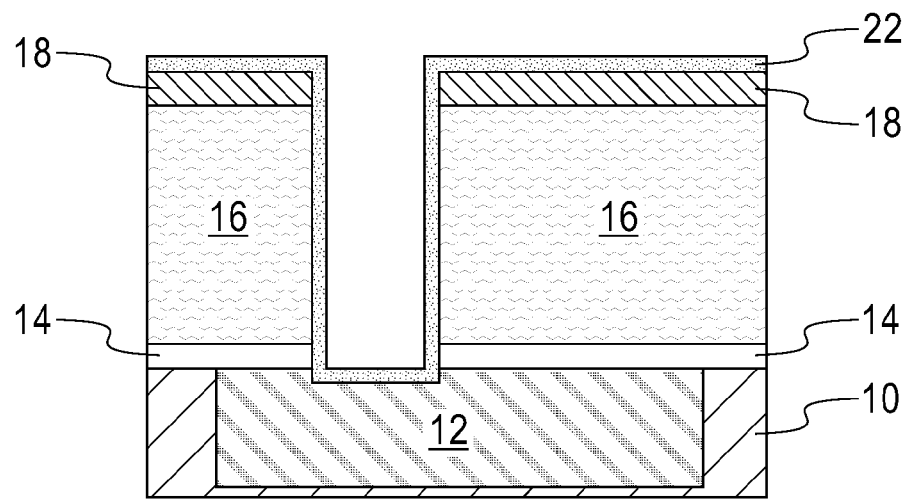
FIG. 2 is a cross sectional view of the exemplary semiconductor structure of FIG. 1 after forming a continuous layer of a sacrificial material in the via opening and above a topmost surface of the second interconnect dielectric material layer.

Referring now to FIG. 2, there is illustrated the exemplary semiconductor structure of FIG. 1 after forming a continuous layer (i.e., without voids and/or breaks) of a sacrificial material 22 in the via opening 20 and above a topmost surface of the second interconnect dielectric material layer 16. In the illustrated embodiment, portions of the continuous layer of sacrificial material 22 are present directly on a topmost surface of the hard mask layer 18, while other portions of the continuous layer of sacrificial material 22 line the entirety of the via opening 20. In other embodiments (not shown), portions of the continuous layer of sacrificial material 22 are present directly on the topmost surface of the second interconnect dielectric material layer 16, while other portions of the continuous layer of sacrificial material 22 line the entirety of the via opening 20.

In one embodiment, the continuous layer of sacrificial material 22 includes any dielectric material that has a different composition than the dielectric materials that provide hard mask layer 18, the second interconnect dielectric material layer 16 and the dielectric capping layer 14. In another embodiment, the continuous layer of sacrificial material 22 may include a metallic material. Some examples of materials that can be used as the continuous layer of sacrificial material 22 include both oxide and nitride materials such as $SiO_2$, $Si_3N_4$, TaN, or TiN. The thickness of the continuous layer of sacrificial material 22 may vary depending on the deposition process used as well as the material employed; the continuous layer of sacrificial material 22 does not completing fill in the entire volume of the via opening 20. In some embodiments, the continuous layer of sacrificial material 22 may have a thickness from 1 nm to 50 nm; although other thicknesses for the diffusion barrier material are contemplated and can be employed. The continuous layer of sacrificial material 22 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 3:
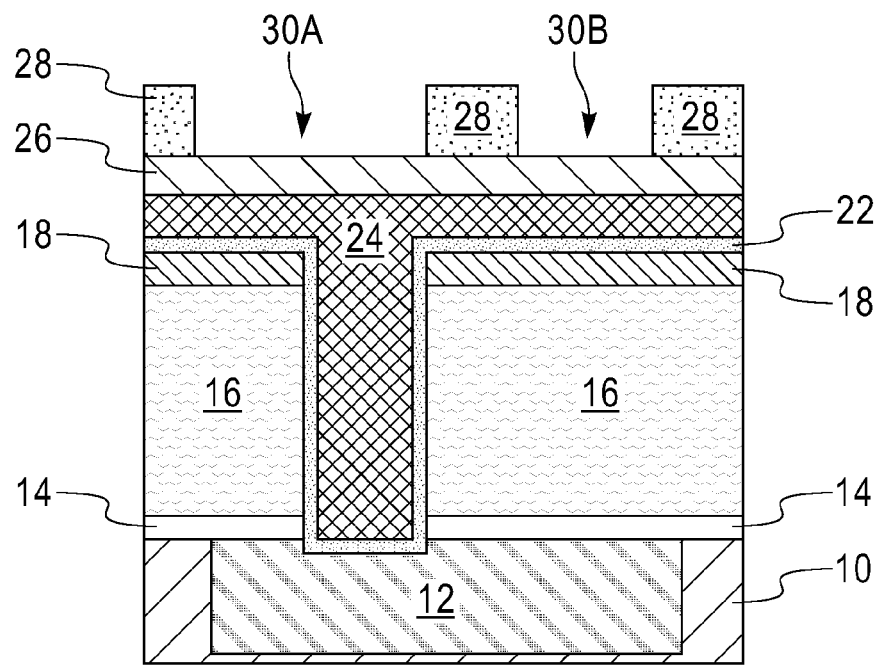
FIG. 3 is a cross sectional view of the exemplary semiconductor structure of FIG. 2 after forming a material stack of an organic planarization layer (OPL), a hard mask layer and a patterned photoresist having at least one line pattern formed therein.

Referring now to FIG. 3, there is illustrated the exemplary semiconductor structure of FIG. 2 after forming a material stack (i.e., a litho material stack) of an organic planarization layer (OPL) 24, a hard mask layer 26 and a patterned photoresist 28 having at least one line pattern 30A formed therein. The at least one line pattern 30A is formed directly above the via opening 20 such that the subsequently formed line opening is in direct communication with the via opening. Other line patterns, such as line pattern 30B, can be present in the patterned photoresist 28 and are positioned over areas of the second interconnect dielectric material layer 16 containing no via openings directly beneath the other line pattern.

The organic planarization layer (OPL) 24 of the material stack fills in a remaining volume of the via opening 20 and is formed on exposed surface of the continuous layer of sacrificial material 22. In some embodiments, the organic planarization layer (OPL) 24 can function as an antireflective coating (ARC). The organic planarization layer (OPL) 24 includes any organic planarizing material. In one embodiment, the organic planarization layer (OPL) 24 is composed mainly of C, H and O (near frictionless carbon is one example). The organic planarization layer (OPL) 24 can be formed by a deposition process such as, for example, CVD, PECVD, evaporation or spin-on coating.

Hard mask layer 26 includes one of the hard mask materials mentioned above for hard mask layer 18. In one embodiment, hard mask layer 26 may comprise a same hard mask material as hard mask layer 18. In another embodiment, hard mask layer 26 may comprise a different hard mask material than hard mask layer 18. Hard mask 26 can be formed utilizing one of the deposition processes as mentioned above for providing the hard mask layer 18. The hard mask layer 26 can have a thickness within the range mentioned above for hard mask layer 18.

Patterned photoresist 28 may comprise a positive-tone photoresist material, a negative-tone photoresist material or a hybrid photoresist material as are conventional and known in the art. The patterned photoresist 28 can be formed by first depositing the appropriate photoresist material by, for example, CVD, PECVD, evaporation or spin-on coating, followed by exposing and developing the deposited photoresist material so as to define at least one line pattern in the photoresist material. The thickness of the photoresist material that provides the patterned photoresist 28 can be from 20 nm to 300 nm, although lesser and greater thicknesses can also be employed.

Figure 4:
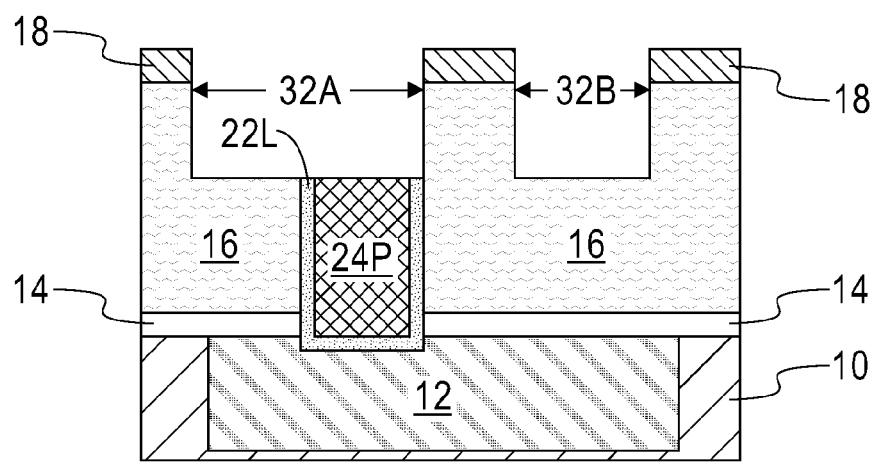
FIG. 4 is a cross sectional view of the exemplary semiconductor structure of FIG. 3 after forming at least one line opening within an upper portion of the second interconnect dielectric material layer and removing the entirety of the patterned photoresist and the entirety of the hard mask layer and portions of the organic planarization layer (OPL) and portions of the continuous layer of sacrificial material, wherein maintaining a portion of the organic planarization layer (OPL) and a portion of the continuous layer of sacrificial material in a bottom portion of the via opening.

Referring now to FIG. 4, there is illustrated the exemplary semiconductor structure of FIG. 3 after forming at least one line opening 32A within an upper portion of the second interconnect dielectric material layer 16 and removing the entirety of the patterned photoresist 28 and the entirety of the hard mask layer 26 and portions of the organic planarization layer (OPL) 24 and portions of the continuous layer of sacrificial material 22, wherein maintaining a portion of the organic planarization layer (OPL) and a portion of the continuous layer of sacrificial material 22 in a bottom portion of the via opening; the top portion of the original via opening is used to provide the line opening 32A. The remaining portion of the organic planarization layer (OPL) can be referred to herein as a planarization dielectric material portion 24P, and the remaining portion of the continuous layer of sacrificial material can be referred to herein as a sacrificial material liner 22L. In some embodiments, and as shown, another line opening 32B can be formed at this point of the present application. Line opening 32B is optional and is formed in an upper portion of the second interconnect dielectric material layer 16 not containing any via opening.

Line openings 32A, 32B have a width that is generally greater than a width of via opening 20. Line opening 323A is in direct communication with a remaining portion (i.e., the bottom portion) of via opening 20. Line openings 32A, 32B can be formed by transferring the line pattern 30A, 30B present in the patterned photoresist 28 into the underlying portions of the hard mask 26, the organic planarizing layer (OPL) 24, the continuous layer of sacrificial material 22, the hard mask layer 18 and the second interconnect dielectric material layer 16. The transferring may include one or more etching steps. The one or more etching steps may include dry etching (such as, for example, reactive ion etching), chemical wet etching or any combination of dry etching and wet etching. The patterned photoresist 28 can be stripped from the structure anytime after the line patterns 30A, 30B are transferred into the hard mask layer 26. The stripping of the patterned photoresist 28 may include any conventional resist removal process such as, for example, ashing. The unetched portions of the hard mask layer 26 and the OPL 24 not present in the bottom portion of the via opening 20 can be removed utilizing one or more etching steps separate from the etch used during the line pattern transferring process.

In the present application, sidewall of the remaining portion of the via opening 20 is protected by the continuous layer of sacrificial material 22 during the formation of the line opening 32A as such the profile (i.e., geometry) of the via opening 20 is maintained. Hence, the via opening 20 that remains maintains its substantially vertical sidewalls.

As is shown in FIG. 4, a topmost surface of the portion of the OPL (i.e., OPL portion 24P) and the portion of the continuous layer of sacrificial material (i.e., the sacrificial material liner 22L) that remain within the lower portion of the via opening 20 after the transferring are coplanar with a bottom horizontal surface of the line opening 32A.

Figure 5:
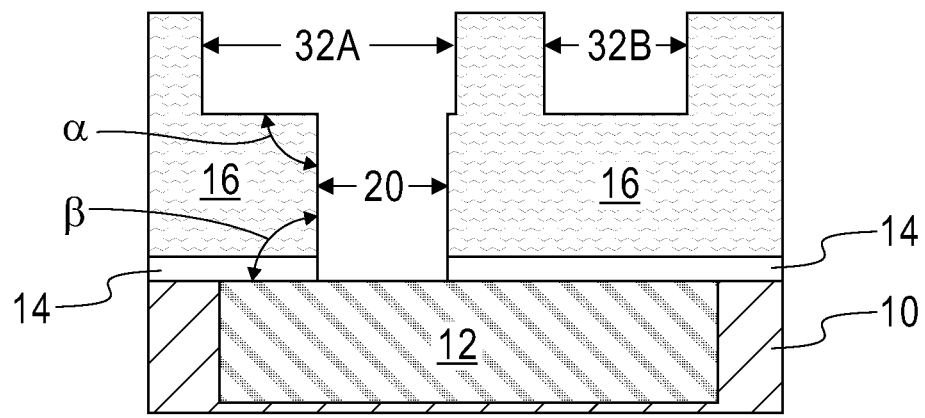
FIG. 5 is a cross sectional view of the exemplary semiconductor structure of FIG. 4 after removing the remaining portion of the organic planarization layer (OPL) and the remaining portion of the continuous layer of sacrificial material from within the bottom portion of the via opening.

Referring now to FIG. 5, there is illustrated the exemplary semiconductor structure of FIG. 4 after removing the remaining portion of the organic planarization layer (OPL) (i.e., the OPL portion 24P) and the remaining portion of the continuous layer of sacrificial material (i.e., the sacrificial material liner 22L) from within the bottom portion of the via opening 20. In some embodiments, and if present, the hard mask layer 18 can be removed from the exemplary semiconductor structure at this point of the present application. In other embodiments, the hard mask layer 18 can be removed during the planarization process described in FIG. 7 of the present application. In still other embodiments, the hard mask layer 18 may remain in the final structure.

The OPL portion 24P can be removed utilizing an etch that is selective in removing the organic planarizing material that provides the OPL portion 24P. In one example, the etch used to remove the OPL portion 24P may include oxygen e.g., $O_2$ or $O_3$. The sacrificial material liner 22L can be removed utilizing an etch that is selective in removing the dielectric material that provides the sacrificial material liner 22L. In one example, the etch used to remove the sacrificial material liner 22L may include acids such as, HF, $H_2SO_4$, HCl, $H_2O_2$, $H_xNO_4$ or any mixture of said acids. The hard mask layer 18 may be removed utilizing an etching process or a planarization process such as, for example, chemical mechanical polishing may be used.

In FIG. 5, angle alpha, α, as measured from an outside vertical sidewall of the via opening 20 to the bottom horizontal surface of the line opening 32A is from 90° to 110°. In prior art processes in which no sacrificial material is used, this same angle is typically from 115° to 140°. In the illustrated embodiment, the via opening 20 and the line opening 32A collectively provide a combined via opening/line opening formed in the second interconnect dielectric material layer 16. In FIG. 5, angle beta, β, as measured from an outside vertical sidewall of the via opening 20 to the topmost horizontal surface of the interconnect metal or metal alloy 12 is from 70° to 90°. In prior art processes in which no sacrificial material is used, this same angle is typically from 40° to 65°.

Figure 6:
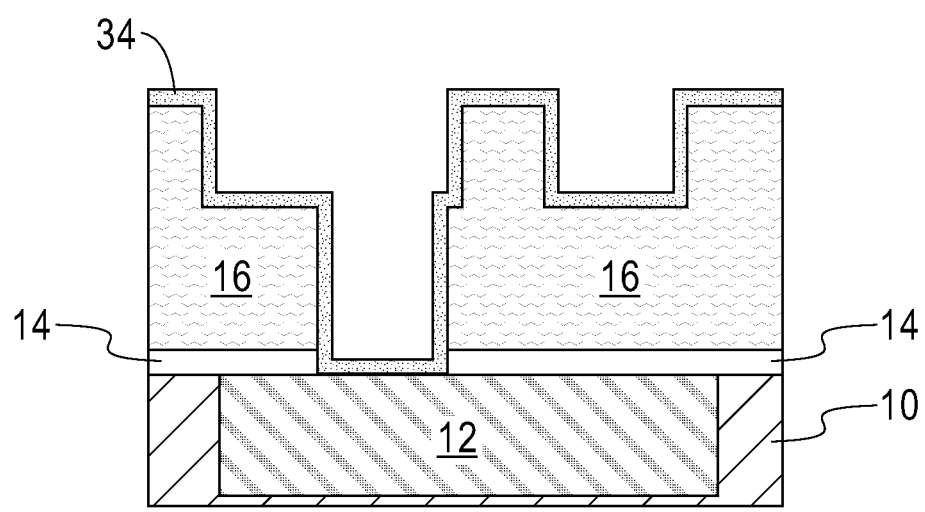
FIG. 6 is a cross sectional view of the exemplary semiconductor structure of FIG. 5 after forming a continuous layer of a diffusion barrier material.

Referring now to FIG. 6, there is illustrated the exemplary semiconductor structure of FIG. 5 after forming a continuous layer of a diffusion barrier material 34 within each line opening and via opening present in the exemplary structure. The continuous layer of diffusion barrier material 34 includes one of the diffusion barrier materials mentioned previously in the present application. The continuous layer of diffusion barrier material 34 can be formed, and have a thickness, as also defined above.

Figure 7:
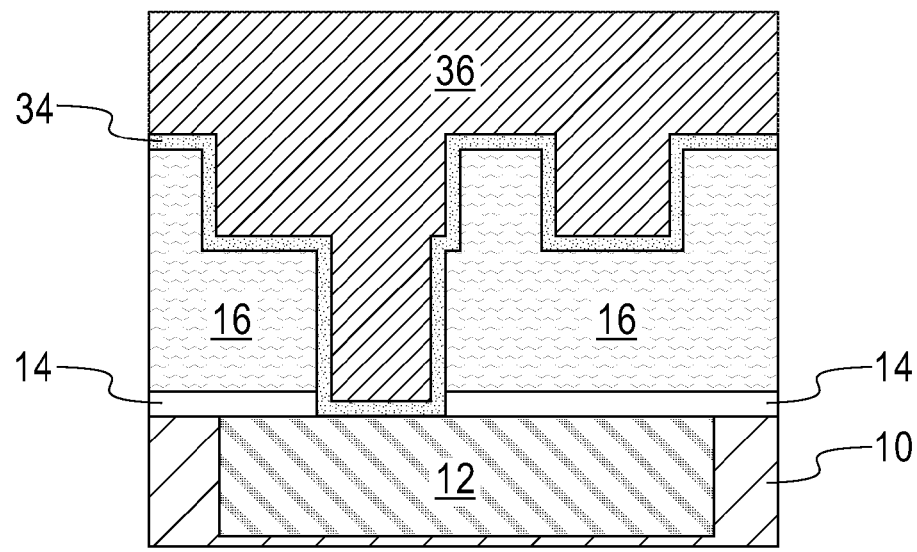
FIG. 7 is a cross sectional view of the exemplary semiconductor structure of FIG. 6 after forming a layer of another interconnect metal or metal alloy.

Referring now to FIG. 7, there is illustrated the exemplary semiconductor structure of FIG. 6 after forming a layer of another interconnect metal or metal alloy 36 on an exposed surface of the continuous diffusion barrier material 34. The layer of another interconnect metal or metal alloy 36 may include one of the metals or metal alloys mentioned above for interconnect metal or metal alloy 12. In one embodiment, the layer of another interconnect metal or metal alloy 36 may comprise a same metal or metal alloy as interconnect metal or metal alloy 12. In another embodiment, the layer of another interconnect metal or metal alloy 36 may comprise a different metal or metal alloy than interconnect metal or metal alloy 12. The layer of another interconnect metal or metal alloy 36 may be formed utilizing one of the deposition processes mentioned above for providing interconnect metal or metal alloy 12.

Figure 8:
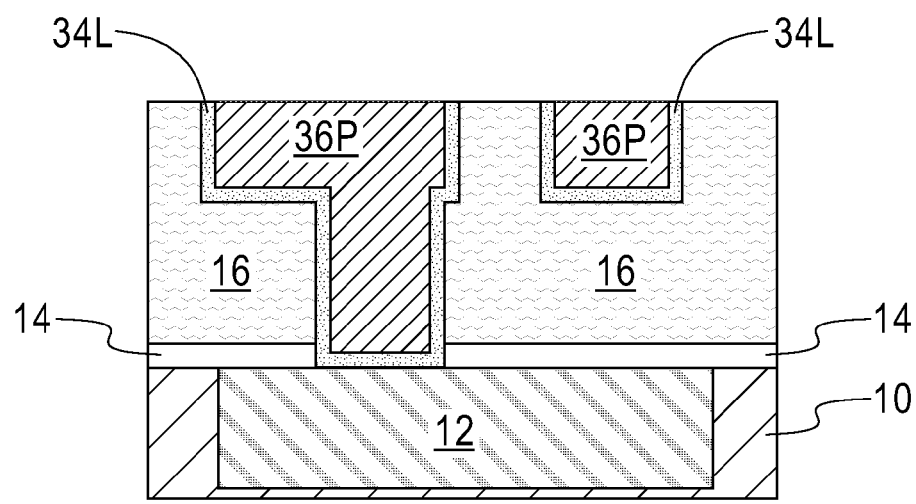
FIG. 8 is a cross sectional view of the exemplary semiconductor structure of FIG. 7 after performing a planarization process.

Referring now to FIG. 8, there is illustrated the exemplary semiconductor structure of FIG. 7 after performing a planarization process. Planarization may include chemical mechanical polishing (CMP) and/or grinding. The planarization process removes portions of the layer of another interconnect metal or metal alloy and portions of the continuous diffusion barrier material 34 that are present outside the line openings 32A, 32B and atop the second interconnect dielectric material layer 16. A portion of the continuous layer of diffusion barrier material 34 and a portion of the layer of the another metal or metal alloy 36 remain in each line opening and via opening present in the exemplary semiconductor structure. Each remaining portion of the continuous layer of diffusion barrier material 34 can be referred to as a diffusion barrier liner 34L; in the drawing, a first diffusion barrier liner 34L is present in the combined via opening 20/line opening 32A, and another diffusion barrier liner 34L is present in line opening 32B. Each remaining portion of the layer of another metal or metal alloy 34 can be referred to as another (or a second) interconnect metal or metal alloy 36P. A planar structure is provided in which a topmost surface of each of the diffusion barrier liners 34L and the another metal or metal alloy 36P are coplanar with each other as well as being coplanar with the topmost surface of the second interconnect dielectric material layer 16.

Due to maintaining the angle alpha from 90° to 110°, shorts between the adjacent metal lines is reduced and circuit reliability is maintained. Due to maintaining the angle beta from 70° to 90°, shorts to the underlying interconnect metal or metal alloy 12 is also reduced and circuit reliability is also maintained.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

forming a via opening in an interconnect dielectric material layer;

forming a continuous layer of a sacrificial material lining the entirety of said via opening;

forming a material stack comprising an organic planarization layer (OPL) and a patterned photoresist above said interconnect dielectric material layer, wherein a portion of said OPL fills a remaining volume of said via opening, and wherein said patterned photoresist contains a line pattern that is present directly above said via opening;

transferring said line pattern to an upper portion of said interconnect dielectric material layer, wherein a portion of said OPL and a portion of said continuous layer of sacrificial material remain within a lower portion of the via opening after said transferring;

removing said remaining portions of said OPL and said sacrificial material from said bottom portion of said via opening after said transferring to provide a combined via opening/line opening; and forming an interconnect metal or metal alloy within said combined via opening/line opening.

2. The method of claim 1, wherein an angle alpha, α, as measured from an outside vertical sidewall of said bottom portion of said via opening to a bottom horizontal surface of said line opening is from 90° to 110°.

3. The method of claim 1, further comprising another interconnect dielectric material layer located beneath said interconnect dielectric material layer, wherein an interconnect metal or metal alloy is embedded in said another interconnect dielectric material, wherein said via opening exposes a surface of said interconnect metal or metal alloy embedded in said another dielectric material layer, and wherein an angle beta, β, as measured from an outside vertical sidewall of said bottom portion of said via opening to a topmost horizontal surface of said interconnect metal or metal alloy is from 70° to 90°.

4. The method of claim 2, further comprising a dielectric capping layer separating said interconnect dielectric material layer from said another interconnect dielectric material layer, wherein said via opening extends through said dielectric capping layer.

5. The method of claim 1, further comprising a hard mask layer located directly on a topmost surface of said interconnect dielectric layer, wherein said via opening extends through said hard mask layer.

6. The method of claim 1, wherein said continuous layer of sacrificial material comprises a dielectric or metallic oxide or nitride.

7. The method of claim 1, wherein said material stack further comprises a hard mask layer located between said OPL and said patterned photoresist.

8. The method of claim 1, wherein a topmost surface of said portion of said OPL and said portion of said continuous layer of sacrificial material that remain within said lower portion of the via opening after said transferring are coplanar with a bottom horizontal surface of said line opening.

9. The method of claim 1, wherein said forming said interconnect metal or metal alloy comprises:

forming a continuous layer of a diffusion barrier material;

forming a layer of an interconnect metal or metal alloy on said continuous layer of said diffusion barrier material; and removing portions of said layer of said interconnect metal or metal alloy and portions of continuous layer of said diffusion barrier material that are present outside said combined via opening and line opening.

10. The method of claim 1, wherein said transferring said line pattern to said upper portion of said interconnect dielectric material layer comprises one or more etching processes.

11. A semiconductor structure comprising:

an interconnect dielectric material layer containing a combined via opening/line opening, wherein an angle alpha, α, as measured from an outside vertical sidewall of said via opening to a bottom horizontal surface of said line opening is from 90° to 110°; and another interconnect dielectric material layer located beneath said interconnect dielectric material layer, wherein an interconnect metal or metal alloy is embedded in said another interconnect dielectric material, wherein said via opening exposes a surface of said interconnect metal or metal alloy embedded in said another dielectric material layer, and wherein an angle beta, β, as measured from an outside vertical sidewall of said via opening to a topmost horizontal surface of said interconnect metal or metal alloy is from 70° to 90°.

12. The semiconductor structure of claim 11, further comprising a diffusion barrier liner lining an entirety of said combined via opening/line opening.

13. The semiconductor structure of claim 12, further comprising an interconnect metal or metal alloy located on an exposed surface of said diffusion barrier liner and present in said combined via opening/line opening.

14. The semiconductor structure of claim 13, wherein a topmost surface of each of said diffusion barrier liner and said interconnect metal or metal alloy is coplanar with each other and coplanar with a topmost surface of said interconnect dielectric material layer.

15. The semiconductor structure of claim 11, further comprising a dielectric capping layer separating said interconnect dielectric material layer from said another interconnect dielectric material layer, wherein said via opening extends through said dielectric capping layer.

16. The semiconductor structure of claim 11, further comprising another line opening located in said interconnect dielectric material layer and adjacent to said combined via opening/line opening.

17. The semiconductor structure of claim 16, wherein said another line opening contains a diffusion barrier liner lining an entirety of said line opening, and an interconnect metal or metal alloy located on an exposed surface of said diffusion barrier liner and present in said line opening.

18. The semiconductor structure of claim 11, wherein said interconnect metal or metal alloy comprises copper (Cu), a copper-aluminum alloy (Cu—Al), a copper-manganese alloy (Cu—Mn), aluminum (Al), or an aluminum-copper alloy (Al—Cu).

19. The semiconductor structure of claim 11, wherein said via opening of said combined via opening/line opening is located directly beneath said line opening of said combined via opening/line opening.

\* \* \* \* \*